(12) United States Patent
Qi et al.

(10) Patent No.: US 10,340,303 B2
(45) Date of Patent: Jul. 2, 2019

(54) METHOD AND APPARATUS FOR BACKSIDE ILLUMINATION SENSOR

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Dekui Qi, Shanghai (CN); Fucheng Chen, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/922,514

(22) Filed: Mar. 15, 2018

(65) Prior Publication Data

US 2018/0323226 A1 Nov. 8, 2018

(30) Foreign Application Priority Data

May 8, 2017 (CN) .......................... 2017 1 0315963

(51) Int. Cl.
*H01L 27/146* (2006.01)
*H01L 21/28* (2006.01)
*H01L 21/768* (2006.01)
*H01L 21/3213* (2006.01)

(52) U.S. Cl.
CPC .... *H01L 27/1464* (2013.01); *H01L 21/28123* (2013.01); *H01L 21/3213* (2013.01); *H01L 21/76834* (2013.01); *H01L 21/76849* (2013.01); *H01L 27/14603* (2013.01); *H01L 27/14645* (2013.01)

(58) Field of Classification Search
CPC ........... H01L 27/1464; H01L 27/14603; H01L 21/76834; H01L 27/14645
See application file for complete search history.

(56) References Cited

U.S. PATENT DOCUMENTS

2011/0049707 A1* 3/2011 Seto .................. H01L 24/11
257/737
2014/0349383 A1* 11/2014 Ota ................... G01N 21/645
435/288.7

* cited by examiner

*Primary Examiner* — Dung A. Le
(74) *Attorney, Agent, or Firm* — Kilpatrick Townsend & Stockton LLP

(57) ABSTRACT

A semiconductor device includes a device substrate having a dielectric layer and a metal wire in the dielectric layer, a first opening on the metal wire and having a bottom at a depth the same as an upper surface of the metal wire, a first insulation layer including a first color filter material on sidewalls of the first opening, a second opening disposed at opposite ends of the semiconductor device and having a bottom at a depth the same as the depth of the bottom of the first opening, and a second insulation layer including a second color filter material on sidewalls of the second opening. The first opening is for leading out the metal wire to a pad. The second opening is disposed along scribe lines. The semiconductor device simplifies the process of drawing out and isolating the pads and satisfies technical requirements of a back seal ring.

17 Claims, 4 Drawing Sheets

METHOD AND APPARATUS FOR BACKSIDE ILLUMINATION SENSOR

CROSS-REFERENCES TO RELATED APPLICATIONS

This application claims priority to Chinese patent application No. 201710315963.4, filed on May 8, 2017, the content of which is incorporated herein by reference in its entirety.

FIELD OF THE INVENTION

The present disclosure relates to the field of integrated circuits, and more particularly to a CMOS image sensor and method of fabricating the CMOS image sensor.

BACKGROUND OF THE INVENTION

Conventional back-side illuminated (BSI) devices require multiple lithography steps and etching processes (e.g., back-side silicon lithography and etching, interlayer dielectric deposition, wiring deposition, etc.) to implement the pad-out and isolation. The process steps are cumbersome and costly. Furthermore, there are currently no good designs and manufacturing techniques available of a backside seal ring that can reliably seal BSI devices.

The following description, together with accompanying drawings, will provide a better understanding of the nature and advantages of the claimed disclosure.

BRIEF SUMMARY OF THE INVENTION

The present inventors provide a novel semiconductor device and manufacturing method thereof to solve the above-described problems.

One aspect of the present invention provides a novel manufacturing method that can simplified the process of drawing out and isolating the pads and satisfying the technical requirements of a back seal ring.

Another aspect of the present invention provides a novel semiconductor device. In some embodiments, a semiconductor device includes a device substrate including a dielectric layer and a metal wire in the dielectric layer, a first opening over the metal wire, the first opening having a bottom at a depth the same as an upper surface of the metal wire, and a first insulation layer including a first color filter material on sidewalls of the first opening.

In one embodiment, the semiconductor device also includes a second opening disposed at opposite ends of the semiconductor device and having a bottom at a depth the same as the depth of the bottom of the first opening, and a second insulation layer including a second color filter material on sidewalls of the second opening.

In one embodiment, the semiconductor device further includes a pixel region on the device substrate. The pixel region includes a plurality of pixel units including a third color filler material and being separated from each other by a metal grid. The semiconductor device also includes a microlens on each of the plurality of pixel units.

In one embodiment, the metal grid includes aluminum or tungsten.

In one embodiment, each of the first color filter material and the second color filter material includes a same color filter material or different color filter materials.

In one embodiment, each of the depth of the first opening and the depth of the second opening is less than or equal to 3 microns. The first opening has a width greater than or equal to 40 microns.

In one embodiment, the semiconductor device further includes a carrier substrate configured to carry the device substrate.

Embodiments of the present invention also provide a method for manufacturing a semiconductor device. The method may include providing a device substrate including a dielectric layer and a metal wire in the dielectric layer, forming a first opening having a bottom at a depth the same as an upper surface of the metal wire, and forming a first insulation layer including a first color filter material on sidewalls of the first opening.

In one embodiment, the method further includes forming a second opening disposed at opposite ends of the semiconductor device and having a bottom at a depth the same as the depth of the bottom of the first opening, and forming a second insulation layer including a second color filter material on sidewalls of the second opening.

In one embodiment, the method further includes forming a patterned metal grid having a plurality of openings on the device substrate, forming an oxide layer on the patterned metal grid filling the plurality of openings, removing a portion of the oxide layer in the openings to form a plurality of gaps, and filling the plurality of gaps with a third color filter material.

In one embodiment, the method also includes, after forming the oxide layer and prior to removing the portion of the oxide layer in the openings, planarizing the oxide layer.

In one embodiment, each of the first insulation layer and the second insulation layer is formed by a lithography and etching process of the first color filter material and the second color filter material, respectively.

In one embodiment, each of the first color filter material and the second color filter material may include a same color filter material or different color filter materials. In one embodiment, the different color filter materials include a red color filter material, a yellow color filter material, and a green color filter material.

In one embodiment, the method further includes forming a carrier layer below the device substrate.

Embodiments of the present invention promote the use of a color filter material to form an insulation layer disposed on the sidewalls of the first opening simplifies the process of drawing and isolating a pad, and an insulation layer of a color filter material on sidewalls of the second openings at opposite ends of the semiconductor device along the scribe lines can satisfy the technical requirements of a back sealing ring.

The following description, together with accompanying drawings, will provide a better understanding of the nature and advantages of the claimed invention.

BRIEF DESCRIPTION OF THE DRAWINGS

The accompanying drawings, referred to herein and constituting a part hereof, illustrate embodiments of the disclosure. The drawings together with the description serve to explain the principles of the invention.

DETAILED DESCRIPTION OF THE INVENTION

Figure 1:
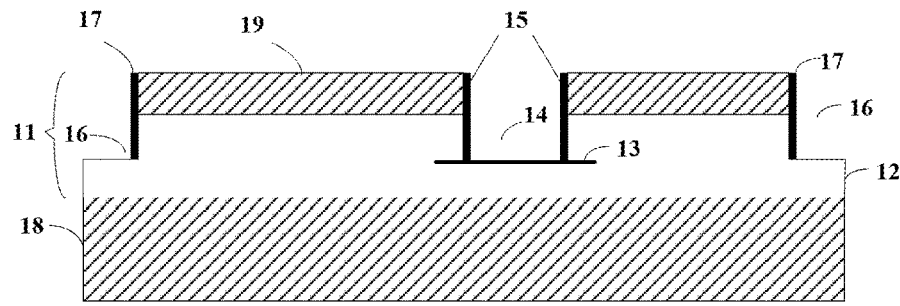
FIG. 1 is a cross-sectional view of a semiconductor device according to one embodiment of the present invention.

In the following description, numerous specific details are provided for a thorough understanding of the present invention. However, it should be appreciated by those of skill in the art that the present disclosure may be realized without one or more of these details. In other examples, features and techniques known in the art will not be described for purposes of brevity.

It should be understood that the drawings are not drawn to scale, and similar reference numbers are used for representing similar elements. Embodiments of the disclosure are described herein with reference to cross-section illustrations that are schematic illustrations of idealized embodiments (and intermediate structures) of the disclosure. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing.

It will be understood that, when an element or layer is referred to as "on," "over," "overlying," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Relative terms such as "higher", "lower", "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped (turned over), the description of an element being "below" or "underneath" another element would then be oriented as "above" the other element. Therefore, the term "below," "under," or "underneath" can encompass both orientations of the device. Because devices or components of embodiments of the present disclosure can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

Embodiments of the present disclosure are described herein with reference to cross-section illustrations that are schematic illustrations of idealized embodiments (and intermediate structures) of the disclosure. The thickness of layers and regions in the drawings may be exaggerated for clarity. Additionally, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the disclosure.

The term "substrate" may include any structure having an exposed surface with which to form an integrated circuit. The term "substrate" is understood to include semiconductor wafers and is also used to refer to semiconductor structures during processing and may include other layers that have been fabricated thereupon. A "substrate" may include doped and undoped semiconductor wafers, epitaxial semiconductor layers, as well as other semiconductor structures.

FIG. 1 is a cross-sectional view of a semiconductor device according to one embodiment of the present invention.

Referring to FIG. 1, the semiconductor device includes a device substrate 11, a metal wire 13, a first opening 14, and a first insulation layer 15.

In one embodiment, device substrate 11 includes a silicon layer 19 and a dielectric layer 12. Metal wire 13 is disposed in dielectric layer 12. First opening 14 has a bottom that is at a depth the same as the upper surface of metal wire 13. That is, the bottom of first opening 14 is at a constant depth that is flush with the upper surface of metal wire 13. First insulation layer 15 is disposed on sidewalls of first opening 14 and formed of a same color filter material or by stacking a plurality of different color filter materials, such as red, yellow, and green color filter materials.

In one embodiment, the semiconductor device also includes a second opening 16 and a second insulation layer 17.

Second opening 16 is disposed at opposite ends of the semiconductor device and has a depth the same as the depth of first opening 14. Second insulation layer 17 is disposed on sidewalls of second opening 16 and formed of a color filter material or by stacking a plurality of different color filter materials such as red, yellow, and green color filter materials. The color filter materials on the sidewalls of first insulation layer 15 and the color filter materials on the sidewalls of second insulation layer 16 may be the same or different.

In one embodiment, a carrier substrate 18 including silicon is provided below device substrate 11.

In the embodiment, the use of a color filter material to form an insulation layer disposed on the sidewalls of the first opening simplifies the process of leading out and isolating a pad. The formation of scribe lines through the second openings at opposite ends of the semiconductor device can satisfy the technical requirements of a back seal ring. In one embodiment, the metal wire can be a bonding pad. In another embodiment, the metal wire can be electrically connected to a subsequently formed redistribution layer.

Figure 2:
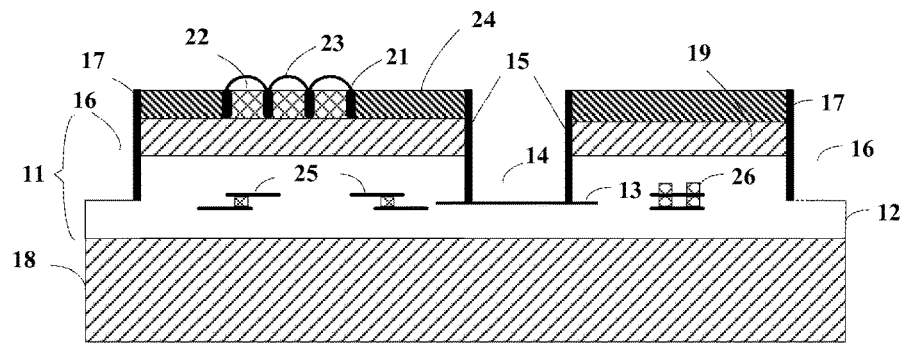
FIG. 2 is a cross-sectional view of a semiconductor device according to another embodiment of the present invention.

FIG. 2 is a cross-sectional view of a semiconductor device according to another embodiment of the present invention.

Referring to FIG. 2, based on the embodiment of FIG. 1, the semiconductor device further includes a pixel region including a metal grid 21 having a plurality of gaps formed therein, a color filter material 22, and a microlens 23.

The gaps in metal grid 21 form a plurality of pixel units, each of the pixel units is filled with color filter material 22, and microlens 23 is disposed on each pixel unit. In the embodiment, an oxide layer 19 is disposed on device substrate 11. A plurality of metal wires 25 may be disposed in dielectric layer 12 and connected by vias 26. Metal grid 21 may include tungsten or aluminum. Color filter material 22 may include a red, green, or blue color filter material, and may be the same or different from the color filter materials on the sidewalls of first insulation layer 15 and the color filter materials on the sidewalls of second insulation layer.

In the embodiment, the insulation layer formed of a color filter material has good insulation and opacity (e.g., black) properties, the metal wires can draw out the pad, simplifying the process of drawing and isolating the pad. The formation of scribe lines through the second openings at opposite ends of the semiconductor device can satisfy the technical requirements of a back seal ring.

Figure 3:
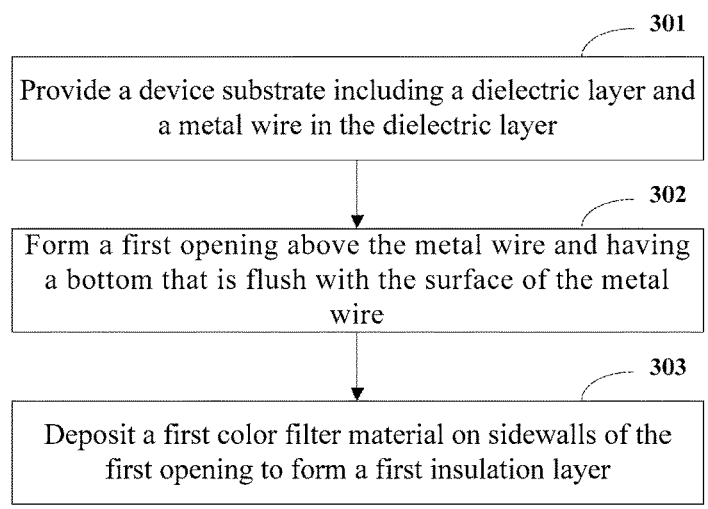
FIG. 3 is a flowchart of a method for manufacturing a semiconductor device having a first color filter material on sidewalls of a first opening according to one embodiment of the present invention.

FIG. 3 is a flowchart of a method for manufacturing a semiconductor device according to one embodiment of the present invention.

Referring to FIG. 3, the method includes, at 301, provide a device substrate including a dielectric layer and a metal wire disposed in the dielectric layer.

Figure 4:
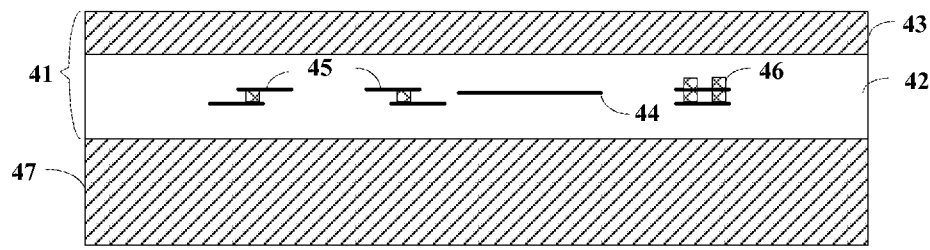
FIG. 4 is a cross-sectional view of an semiconductor device during an intermediate manufacturing stage according to an embodiment of the present invention.

In one embodiment, referring to FIG. 4, a metal wire 44 is formed in dielectric layer 42. A silicon layer 43 is deposited on dielectric layer 42 to form a device substrate 41, and a carrier substrate 47 is formed on device substrate 41. In one embodiment, a plurality of metal wires 46 are formed in the dielectric layer and connected to metal wire 45 through a plurality of vias 46.

The method also includes, at 302, forming a first opening on metal wire 44, the first opening has a bottom at a depth that is at the same level as the upper surface of metal wire 44.

The method also includes, at 303, forming a first color filter material on sidewalls of the first opening.

Figure 5:
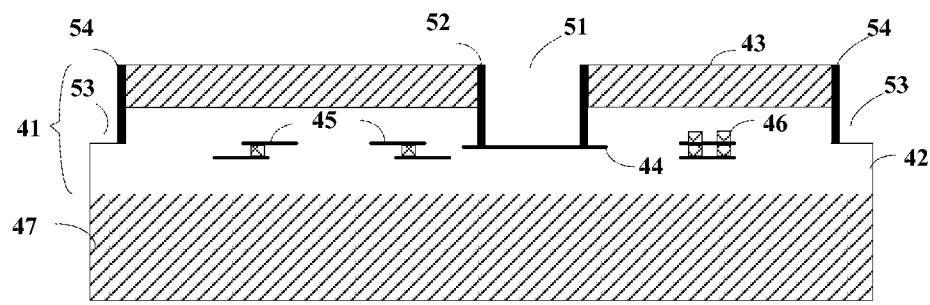
FIG. 5 is a cross-sectional view of an semiconductor device having first and second openings during another intermediate manufacturing stage according to an embodiment of the present invention.

In one embodiment, referring to FIG. 5, a first opening 51 is formed on metal wire 44, first opening 51 has a depth less than or equal to 3 microns (μm) with respect to the upper surface of silicon layer 43 and a width greater than or equal to 40 μm. A first insulation layer 52 is formed on sidewalls of first opening 51 using a photolithography and etching process performed on the first color filter material. The first color filter material may include a stack of a plurality of color filter materials having one color or multiple colors.

Figure 6:
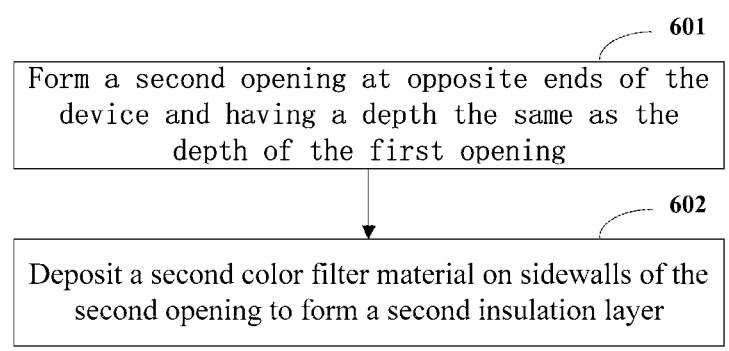
FIG. 6 is a flowchart of a method for manufacturing a semiconductor device having a second color filter material formed on sidewalls of a second opening according to another embodiment of the present invention.

In another embodiment, referring to FIG. 6, the method may further include, at 601, forming a second opening at opposite ends of the semiconductor device and having a depth the same as the depth of the first opening.

The method also includes, at 602, depositing a second color filter material on sidewalls of the second opening to form a second insulation layer.

In one embodiment, referring to FIG. 5, second opening 53 has a depth that is the same as the depth of first opening 51, i.e., the depth of second opening 53 is less than or equal to 3 μm. Second opening 53 has a width greater than or equal to 40 microns. A second insulation layer 54 is formed on sidewalls of second opening 52 by performing a photolithography and etching process on the second color filter material. The second color filter material may include a same color filter material or a stack of a plurality of different color filter materials. The second color filter material may be the same or different from the first color filter material.

In the embodiment, the use of a color filter material to form an insulation layer disposed on the sidewalls of the first opening simplifies the process of drawing and isolating a pad. The formation of scribe lines through the second openings at opposite ends of the semiconductor device can satisfy the technical requirements of a back seal ring.

Figure 7:
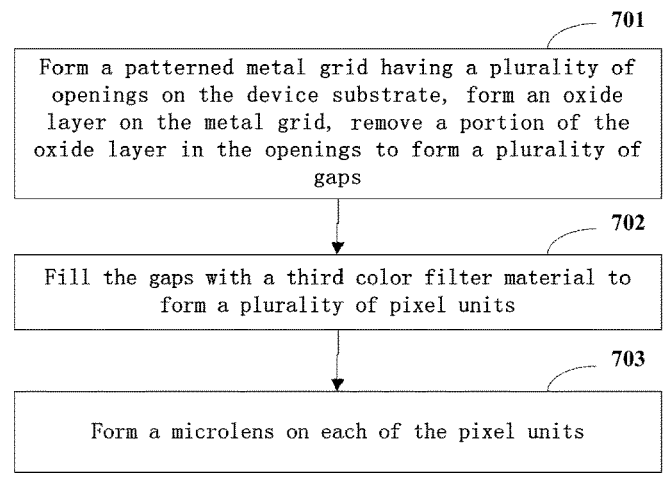
FIG. 7 is a flowchart of a method for manufacturing a semiconductor device having a third color filter material formed on a device substrate according to yet another embodiment of the present invention.

FIG. 7 is a flowchart of a method for manufacturing a semiconductor device according to yet another embodiment of the present invention.

Referring to FIG. 7, the method may include, at 701, forming a patterned metal grid on the device substrate.

Figure 8:
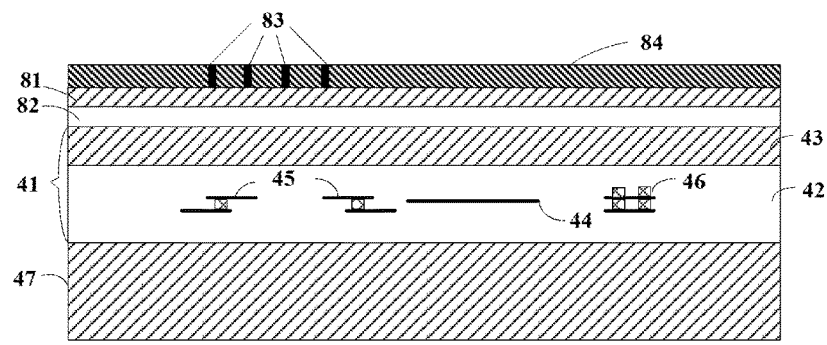
FIG. 8 is a cross-sectional view of an semiconductor device during yet another intermediate manufacturing stage according to an embodiment of the present invention.

In one embodiment, referring to FIG. 8, an anti-reflective layer 82 is formed on device substrate 41, a buffer oxide layer 81 is formed on anti-reflective layer 82, and a patterned metal grid 83 having a plurality of openings is formed on buffer oxide layer 81. Antireflection layer 82 may include hafnium oxide or aluminum oxide, patterned metal grid 83 may include aluminum or tungsten. Patterned metal grid 83 may be formed by a deposition process and a lithography and etching process, and the plurality of grids define a plurality of units. An oxide layer 84 is formed on metal grid 83 filling the openings by a deposition process and then subjected to a planarization treatment (e.g., chemical mechanical polishing process).

Figure 9:
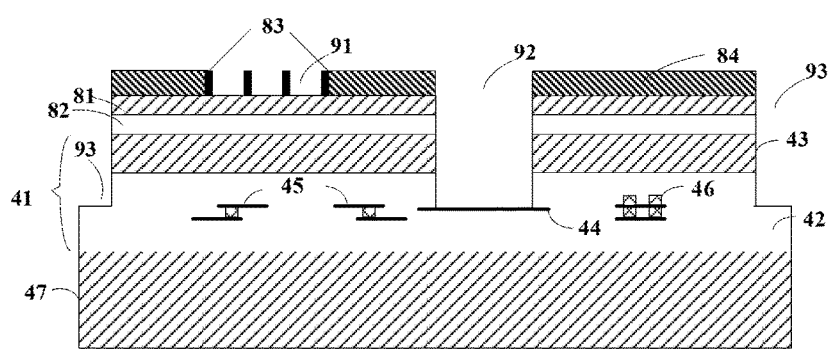
FIG. 9 is a cross-sectional view of an semiconductor device during still another intermediate manufacturing stage according to an embodiment of the present invention.

Referring to FIG. 9, a portion of oxide layer 84 in the openings of patterned metal grid 83 is removed to form a plurality of gaps 91, a first opening 92 is formed on metal wire 44 and a second opening 93 is formed at opposite ends of the semiconductor device. First opening 92 has a bottom that is at a depth the same as the upper surface of metal wire 44. In other words, first opening 92 has a depth equal to the depth of metal wire 44 with respect to the upper surface of oxide layer 84. The depth of first opening 92 is relative to the upper surface of planarized oxide layer 84. Second opening 93 has a depth that is the same as the depth of first opening 92.

Referring still to FIG. 7, the method may include, at 702, filling the gaps with a third color filter material.

The method also includes, at 703, forming a microlens on each of the gaps filled with the third color filter material.

Figure 10:
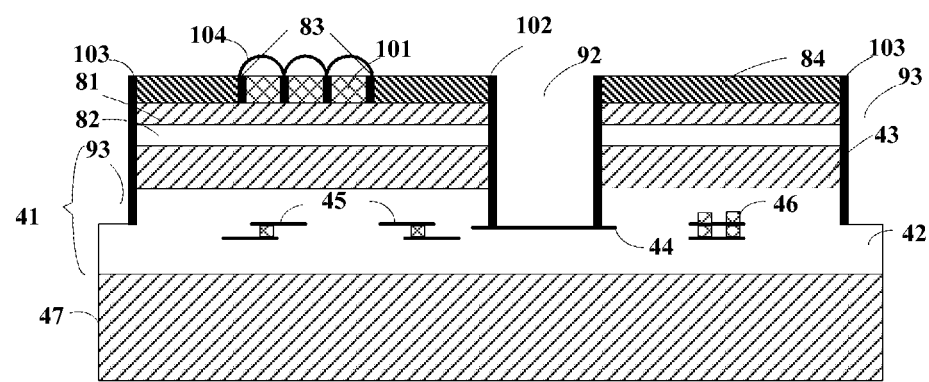
FIG. 10 is a flowchart of a method for manufacturing a semiconductor device according to still another embodiment of the present invention.

In one embodiment, referring to FIG. 10, a third color filter material (which may be a red, yellow, or green color filter material) is formed filling gaps 91 of metal grid 83 to form a plurality of pixel units. A microlens 104 is then formed on each of the pixel units. A photolithography and etching process is performed on the color filter materials in the first and second openings to form a first insulation layer 102 on sidewalls of first opening 92 and a second insulator layer 103 on sidewalls of second opening 93. The first color filter material of the first insulator layer on the sidewalls of the first opening, the second color filter material of the second insulator layer on the sidewalls of the second opening, and the third color filter material filling the gaps in the metal grid may be the same material or different materials.

In the embodiment, the insulation layer formed by a lithography and etching process of a color filter material not only has good insulation and opaque (e.g., black) properties, but also simplifies the process of leading out and isolating a pad. The formation of scribe lines through the second openings at opposite ends of the semiconductor device can satisfy the technical requirements of a back sealing ring.

Embodiment of the present invention thus provide a detailed description of a semiconductor device and method of manufacturing the same.

While the present disclosure is described herein with reference to illustrative embodiments, this description is not intended to be construed in a limiting sense. Rather, the purpose of the illustrative embodiments is to make the spirit of the present disclosure be better understood by those skilled in the art. In order not to obscure the scope of the disclosure, many details of well-known processes and manufacturing techniques are omitted. Various modifications of the illustrative embodiments as well as other embodiments will be apparent to those of skill in the art upon reference to the description. For example, although the pixel region as shown includes three microlenses, and a metal grid is dispose between two adjacent color filters, it is understood that the number of microlenses and gaps in the metal grid can be more than three in other embodiments. It is therefore intended that the appended claims encompass any such modifications.

Furthermore, some of the features of the preferred embodiments of the present disclosure could be used to advantage without the corresponding use of other features. As such, the foregoing description should be considered as merely illustrative of the principles of the disclosure, and not in limitation thereof.

What is claimed is:

1. A semiconductor device, comprising;
   a device substrate including a dielectric layer and a metal wire in the dielectric layer;
   a first opening over the metal wire, the first opening having a bottom at a depth the same as an upper surface of the metal wire; and
   a first insulation layer including a first color filter material on sidewalls of the first opening.

2. The semiconductor device of claim 1, further comprising:
   a second opening disposed at opposite ends of the semiconductor device and having a bottom at a depth the same as the depth of the bottom of the first opening; and
   a second insulation layer including a second color filter material on sidewalls of the second opening.

3. The semiconductor device of claim 2, further comprising:
   a pixel region on the device substrate, the pixel region comprising a plurality of pixel units including a third color filler material, the pixel units being separated from each other by a metal grid; and
   a microlens on each of the plurality of pixel units.

4. The semiconductor device of claim 3, wherein the metal grid comprises aluminum or tungsten.

5. The semiconductor device of claim 2, wherein the first color filter material and the second color filter material each comprise a same color filter material or different color filter materials.

6. The semiconductor device of claim 2, wherein the depth of the first opening and the depth of the second opening each are less than or equal to 3 microns; and
   the first opening has a width greater than or equal to 40 microns.

7. The semiconductor device of claim 1, further comprising:
   a carrier substrate configured to carry the device substrate.

8. A method for manufacturing a semiconductor device, the method comprising:
   providing a device substrate including a dielectric layer and a metal wire in the dielectric layer;
   forming a first opening having a bottom at a depth the same as an upper surface of the metal wire; and
   forming a first insulation layer including a first color filter material on sidewalls of the first opening.

9. The method of claim 8, further comprising:
   forming a second opening disposed at opposite ends of the semiconductor device and having a bottom at a depth the same as the depth of the bottom of the first opening; and
   forming a second insulation layer including a second color filter material on sidewalls of the second opening.

10. The method of claim 9, further comprising:
    forming a patterned metal grid having a plurality of openings on the device substrate;
    forming an oxide layer on the patterned metal grid filling the plurality of openings;
    removing a portion of the oxide layer in the openings to form a plurality of gaps; and
    filling the plurality of gaps with a third color filter material.

11. The method of claim 10, further comprising, after forming the oxide layer and prior to removing the portion of the oxide layer in the openings:
    planarizing the oxide layer.

12. The method of claim 10, wherein the patterned metal grid comprises aluminum or tungsten.

13. The method of claim 9, wherein the first insulation layer and the second insulation layer each are formed by a lithography and etching process of the first color filter material and the second color filter material, respectively.

14. The method of claim 9, wherein the first color filter material and the second color filter material each comprise a same color filter material or different color filter materials.

15. The method of claim 14, wherein the different color filter materials comprise a red color filter material, a yellow color filter material, and a green color filter material.

16. The method of claim 9, wherein the depth of the first opening and the depth of the second opening each are less than or equal to 3 microns; and the first opening has a width greater than or equal to 40 microns.

17. The method of claim 9, further comprising:
forming a carrier layer below the device substrate.

\* \* \* \* \*